(12) United States Patent
Schmieder et al.

(10) Patent No.: US 10,067,311 B2
(45) Date of Patent: Sep. 4, 2018

(54) INTEGRATED LENS BARREL, ACTUATOR, AND MEMS SNUBBER SYSTEMS AND METHODS

(71) Applicant: DigitalOptics Corporation, San Jose, CA (US)

(72) Inventors: Jim Schmieder, Wayland, NY (US); Roman C. Gutierrez, Arcadia, CA (US); Guiqin Wang, Arcadia, CA (US)

(73) Assignee: DigitalOptics Corporation, San Jose, CA (US)

( * ) Notice: Subject to any disclaimer, the term of this patent is extended or adjusted under 35 U.S.C. 154(b) by 13 days.

(21) Appl. No.: 15/483,720

(22) Filed: Apr. 10, 2017

(65) Prior Publication Data

US 2017/0212324 A1 Jul. 27, 2017

Related U.S. Application Data

(60) Division of application No. 14/327,490, filed on Jul. 9, 2014, now Pat. No. 9,621,772, which is a continuation-in-part of application No. 13/844,140, filed on Mar. 15, 2013, now Pat. No. 8,786,967, which is a continuation-in-part of application No. 13/247,898, filed on Sep. 28, 2011, now Pat. No. 8,768,157, which is a continuation-in-part of application No. 13/216,225, filed on Aug. 23, 2011, now Pat. No. 9,146,445, which is a continuation-in-part of application No. 12/946,515, (Continued)

(51) Int. Cl.
| | |
|---|---|
| *G02B 7/04* | (2006.01) |
| *G02B 7/09* | (2006.01) |
| *G02B 27/64* | (2006.01) |
| *H02K 41/035* | (2006.01) |
| *H01L 41/09* | (2006.01) |

(52) U.S. Cl.
CPC ............ *G02B 7/09* (2013.01); *G02B 27/646* (2013.01); *H01L 41/09* (2013.01); *H02K 41/0354* (2013.01)

(58) Field of Classification Search
CPC .. G02B 27/646; G02B 6/3584; G02B 6/3564; G02B 7/023; G02B 7/04; G02B 7/08; G02B 7/09; G03B 3/10; G03B 2205/008; H04N 5/2254
See application file for complete search history.

(56) References Cited

U.S. PATENT DOCUMENTS

| | | | |
|---|---|---|---|
| 9,621,772 B2 * | 4/2017 | Schmieder | ............... G02B 7/08 |
| 2009/0302205 A9 * | 12/2009 | Olsen | ................ H01L 27/14634 250/226 |

* cited by examiner

*Primary Examiner* — Joseph P Martinez

(57) ABSTRACT

Techniques are disclosed for systems and methods to provide concomitant mechanical motion inhibition and electrical distribution for actuator modules, such as microelectromechanical systems (MEMS) based optical actuators adapted to move and/or orient one or more lenses and/or optical devices of a camera module. A mechanical motion inhibition and electrical distribution system may include one or more flexible snubber structures disposed substantially adjacent a MEMS structure and between the MEMS structure and another component of a camera module. Each flexible snubber structure may be implemented with one or more electrical traces, flexible films, snubber films, and/or mechanical stabilizers adapted to route electrical signals to or from the MEMS structure and/or to inhibit mechanical motion of at least a portion of the MEMS structure.

20 Claims, 14 Drawing Sheets

Related U.S. Application Data filed on Nov. 15, 2010, now Pat. No. 8,619,378, which is a continuation of application No. 12/463,234, filed on May 8, 2009, now Pat. No. 8,004,780, which is a continuation of application No. PCT/US2007/084301, filed on Nov. 9, 2007.

(60) Provisional application No. 61/844,292, filed on Jul. 9, 2013.

INTEGRATED LENS BARREL, ACTUATOR, AND MEMS SNUBBER SYSTEMS AND METHODS

CROSS-REFERENCE TO RELATED APPLICATIONS

This patent application is a divisional of and claims the benefit of and priority to U.S. patent application Ser. No. 14/327,490 filed Jul. 9, 2014 and entitled "INTEGRATED LENS BARREL, ACTUATOR, AND MEMS SNUBBER SYSTEMS AND METHODS" which is hereby incorporated by reference in its entirety.

This patent application claims the benefit of and priority to U.S. Provisional Patent Application No. 61/844,292 filed Jul. 9, 2013 and entitled "CAMERA MODULE WITH LENS MOUNTING SURFACE PROTRUDING OUT OF A LENS BARREL FOR MOUNTING OPTICAL DEVICES" which is hereby incorporated by reference in its entirety.

This patent application is a continuation-in-part of and claims the benefit of and priority to U.S. patent application Ser. No. 13/844,140 filed Mar. 15, 2013, issued as U.S. Pat. No. 8,786,967 on Jul. 22, 2014 and entitled "MEMS SNUBBER SYSTEMS AND METHODS" which is hereby incorporated by reference in its entirety.

U.S. patent application Ser. No. 13/844,140 is a continuation-in-part of and claims the benefit of and priority to U.S. patent application Ser. No. 12/946,515 filed Nov. 15, 2010, issued as U.S. Pat. No. 8,619,378 issued on Dec. 31, 2013 and entitled "ROTATIONAL COMB DRIVE Z-STAGE" which is hereby incorporated by reference in its entirety.

U.S. patent application Ser. No. 13/844,140 is a continuation-in-part of and claims the benefit of and priority to U.S. patent application Ser. No. 13/247,898 filed Sep. 28, 2011, issued as U.S. Pat. No. 8,768,157 on Jul. 1, 2014 and entitled "MULTIPLE DEGREE OF FREEDOM ACTUATOR" which is hereby incorporated by reference in its entirety.

U.S. patent application Ser. No. 13/844,140 is a continuation-in-part of and claims the benefit of and priority to U.S. patent application Ser. No. 13/216,225 filed Aug. 23, 2011, issued as U.S. Pat. No. 9,146,445 on Sep. 29, 2015 and entitled "INTEGRATED LENS BARREL" which is hereby incorporated by reference in its entirety.

U.S. patent application Ser. No. 13/216,225 is a continuation of U.S. patent application Ser. No. 12/463,234, filed May 8, 2009, and issued as U.S. Pat. No. 8,004,780 on Aug. 23, 2011, which is a continuation of International Application No. PCT/US2007/084301, filed on Nov. 9, 2007, all of which are hereby incorporated by reference in their entirety. U.S. Provisional Application No. 60/946,217, filed on Jun. 26, 2007 and U.S. Provisional Application No. 60/865,143, filed on Nov. 9, 2006, are hereby incorporated by reference in their entirety.

TECHNICAL FIELD

One or more embodiments of the invention relate generally to mechanical motion control of actuators and more particularly, for example, to systems and methods for concomitant mechanical motion inhibition and electrical distribution for actuator modules.

BACKGROUND

Imaging devices are being implemented with more and more features as consumer demand for such features increases over time. Many such features, such as autofocus and image stabilization, require multiple lenses and other optical devices to be integrated together into the imaging device. At the same time, the imaging devices are themselves being integrated into smaller and more portable electronics devices. As a result, such imaging devices are experiencing larger physical shocks (e.g., a dropped smartphone) in typical use and, due the overall miniaturization, are more prone to damage related to actuator hyperextension and otherwise insufficient and/or unreliable actuator motion inhibition.

Conventional methods used to inhibit actuator motion typically require complex snubber structures that can be difficult and/or expensive to manufacture. Further, increasing snubber complexity typically increases their fragility. Thus, there is a need for an improved methodology to address actuator motion inhibition, particularly in optics assemblies.

SUMMARY

Techniques are disclosed for systems and methods to provide concomitant mechanical motion inhibition and electrical distribution for actuator modules, such as microelectromechanical systems (MEMS) based optical actuators adapted to move and/or orient one or more lenses and/or optical devices of a camera module. In one embodiment, a mechanical motion inhibition and electrical distribution system may include one or more flexible snubber structures disposed substantially adjacent a MEMS structure and between the MEMS structure and another component of a camera module. Each flexible snubber structure may be implemented with one or more electrical traces, flexible films, snubber films, and/or mechanical stabilizers adapted to route electrical signals to or from the MEMS structure and/or to inhibit mechanical motion of at least a portion of the MEMS structure.

In one embodiment, a flexible snubber structure includes a ribbon portion having one or more electrical traces, where the electrical traces are at least partially electrically insulated by a ribbon film; a substantially planar snubber portion having a plurality of mechanical stabilizers embedded in a snubber film; and a folding portion coupling the ribbon portion to the snubber portion, where at least one of the mechanical stabilizers is electrically conductive, and where corresponding ones of the electrical traces are electrically coupled to the electrically conductive mechanical stabilizers.

In another embodiment, a system includes a moveable lens module; a lens barrel; and a flexible snubber structure disposed substantially between the moveable lens module and the lens barrel. In some embodiments, the flexible snubber structure includes a ribbon portion having one or more electrical traces, where the electrical traces are at least partially electrically insulated by a ribbon film; a substantially planar snubber portion having a plurality of mechanical stabilizers embedded in a snubber film; and a folding portion coupling the ribbon portion to the snubber portion, where at least one of the mechanical stabilizers is electrically conductive, and where corresponding ones of the electrical traces are electrically coupled to the electrically conductive mechanical stabilizers.

In a further embodiment, a method includes providing a ribbon portion of a flexible snubber structure, where the ribbon portion has one or more electrical traces, and where the electrical traces are at least partially electrically insulated by a ribbon film; providing a substantially planar snubber portion of a flexible snubber structure, where the substantially planar snubber portion has a plurality of mechanical stabilizers embedded in a snubber film; and providing a folding portion of a flexible snubber structure, where the folding portion couples the ribbon portion to the snubber portion, where at least one of the mechanical stabilizers is electrically conductive, and where corresponding ones of the electrical traces are electrically coupled to the electrically conductive mechanical stabilizers.

In a further embodiment, a mounting surface is provided for mounting an actuator directly on a lens datum surface. The actuator may include a MEMS actuator. Alternatively or in combination with the MEMS actuator, a voice coil motor (VCM) or piezoelectric actuator may be mounted to the mounting surface and/or to another optical surface. This mounting surface, as well as a lens optical surface, protrudes in certain embodiments out of the lens barrel thereby providing the actuator external access to the lens mounting surface. In certain embodiments, the actuator is mounted directly onto this mounting surface. One or more, or several, lens stack tolerances may be eliminated in certain embodiments allowing for greater accuracy in the airspace between optical surfaces, e.g., two lens surfaces.

In certain embodiments, an imaging optical assembly is mostly or partly contained within a lens barrel or other optical housing and a lens mounting surface is protruding out of the object end of the lens barrel for mounting optical devices, e.g., a MEMS actuator and/or a movable lens or lenses coupled to one or more lens actuators.

In one embodiment, a device is provided that includes a moveable lens module; a lens barrel having an opening; at least one lens, disposed in the lens barrel, having a first portion that protrudes through the opening; and in which the moveable lens module is disposed in contact with a surface of the first portion.

In another embodiment, a method of making a camera module is provided, the method including providing a lens barrel having at least one lens disposed in the lens barrel, the lens having a portion that protrudes from an opening in the lens barrel; providing an actuator containing at least one additional lens arranged to be moved by the actuator; moving a portion of a surface of the actuator into contact with the portion of the lens that protrudes from the opening in the lens barrel; and attaching the actuator to the lens barrel such that the portion of the surface of the actuator remains in contact with the portion of the lens that protrudes from the opening in the lens barrel.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
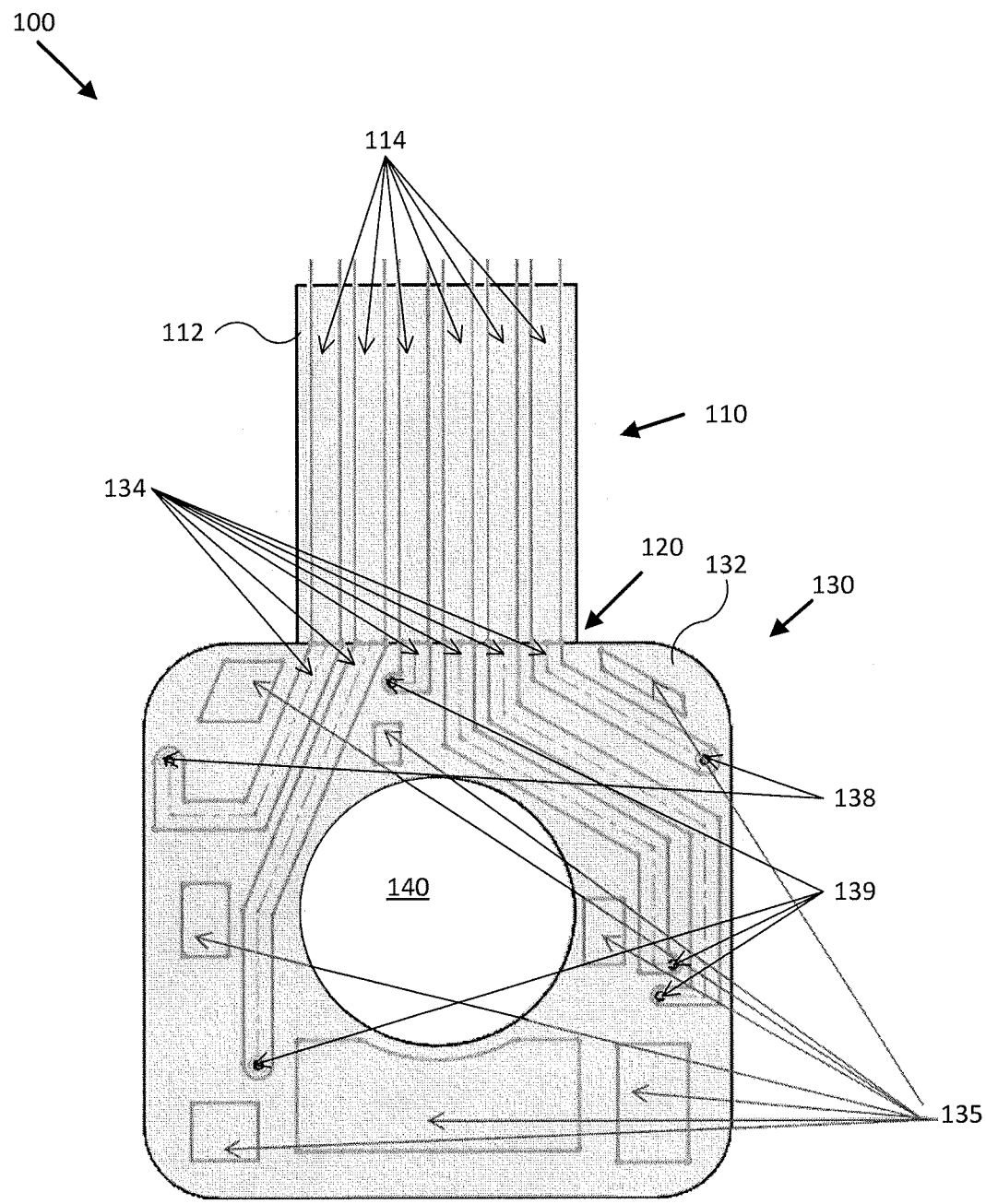
FIG. 1 illustrates a plan view of a flexible snubber structure in accordance with an embodiment of the disclosure.

In accordance with various embodiments of the present disclosure, microelectromechanical systems (MEMS) snubber systems and methods may advantageously include one or more flexible snubber structures disposed substantially adjacent a MEMS structure and between the MEMS structure and another component of a camera module. Each flexible snubber structure may be implemented with one or more electrical traces, flexible films, snubber films, and/or mechanical stabilizers adapted to route electrical signals to or from the MEMS structure and/or to inhibit mechanical motion of at least a portion of the MEMS structure.

By combining snubbing action and electrical distribution in a single structure, smaller actuator modules, optical modules, and camera modules can be achieved, and related assembly can be made simpler due to fewer individualized external wiring connections. Furthermore, embodiments of the present disclosure may be implemented to increase overall tip/tilt alignment of adjacent structures at a reduced fabrication cost, particularly as overall size is reduced.

In one embodiment, a flexible snubber structure may be adapted to provide mechanical stabilizers and/or snubber films of various thicknesses, for example, to inhibit motion of one or more structures according to a particular profile of the structures and/or the desired motion inhibition. In some embodiments, materials used for a flexible snubber structure may be electrically and/or thermally conductive, for example, and such flexible snubber structure may be adapted to thermalize various structures and/or components of a moveable lens module (e.g., actuated by a MEMS actuator) and/or a camera module. In other embodiments, such materials may be electrically and/or thermally insulating, for example, and/or be adapted to provide a particular type of motion inhibition, such as "soft" motion inhibition adapted to minimize shock damage (e.g., as opposed to more rigid motion inhibition adapted to minimize hyper extension of moveable actuator structures).

In the context of the present disclosure, a snubber may be any structure adapted to inhibit and/or help inhibit motion of another structure through constant and/or intermittent mechanical contact. For example, a snubber for an actuator may include one or more surfaces, each having a particular orientation and/or profile, for instance, that are adapted to hard limit motion of a portion of the actuator. In one embodiment, one such surface may help to inhibit all relative motion of a fixed frame of a MEMS actuator, for example, by pressing the fixed frame against an opposite surface, for instance, or by compliantly molding around at least portions of the fixed frame to keep it relatively stationary. In another embodiment, another such surface may inhibit motion of a moveable fame of the MEMS actuator in the actuated range of motions, so as to allow typical actuator motion but minimize and/or eliminate hyperextension of the actuator. In other embodiments, yet another such surface may inhibit motion of the moveable frame in directions other than those in the actuated range of motions, so as to allow typical actuator motion but reduce and/or eliminate a risk of actuator damage due to shock (e.g., a relatively large external force applied suddenly to the actuator in a direction substantially orthogonal to the actuated range of motions).

FIG. 1 illustrates a plan view of a flexible snubber structure 100 in accordance with an embodiment of the disclosure. In the embodiment shown in FIG. 1, system 100 includes flexible ribbon portion 110 and snubber portion 130 coupled to each other by folding portion 120. For example, ribbon portion 110, folding portion 120, and snubber portion 130 may be formed substantially in a plane, for example, and folding portion 120 may be adapted to flex and/or fold away from the plane to facilitate various electrical connections between ribbon portion 110 and other components of a camera module, for example, or an encompassing electronic device (e.g., a personal electronic device, such as a digital camera or a smartphone). In some embodiments, folding portion 120 may be implemented with one or more flexible films, snubber films, film interfaces, flexible conductive layers (e.g., metal layers), and/or stiffeners. In one embodiment, a flexible conducting layer of folding portion 120 may comprise the same conducting layer forming electrical traces 114 of ribbon member 110 and/or electrical traces 134 or mechanical stabilizers 135 of snubber portion 130.

As shown in FIG. 1, flexible ribbon portion 110 may include ribbon film 112 and one or more flexible electrical traces 114. In various embodiments, ribbon portion 110 may be adapted to route one or more electrical signals from a suitable ribbon cable interface, for example, along a potentially curved path, and to electrical traces 134 in snubber portion 130. In one embodiment, ribbon film 112 may be implemented with a suitable dielectric material, such as Mylar, Kapton, a fiber reinforced resin, and/or other flexible materials, for example, and, in some embodiments, may be implemented with a stiffener material added to at least a portion of ribbon film 112 to provide mechanical stiffness for insertion of an end of ribbon portion 110 into a suitable connector (e.g., mounted in or on a camera module and/or an encompassing electronic device, for example).

In further embodiments, ribbon film 112 may be mated with ribbon film 116 (e.g., shown in FIG. 2) to sandwich opposing sides of electrical traces 114 in, for example, flexible insulating, stiffening, and/or otherwise protective material. Ribbon film 116 may be formed, patterned, stiffened, or otherwise applied to ribbon portion 110 using any one or combination of techniques described herein, and may or may not exhibit the same general characteristics of ribbon film 112 (e.g., they may differ in material, thickness, stiffness, thermal and/or electrical conductivity, and in various other characteristics).

Electrical traces 114 may be implemented as a patterned conductive layer (e.g., a copper layer) deposited and/or otherwise formed or attached to ribbon film 112 (e.g., and/or ribbon film 116), as described herein. In various embodiments, electrical traces 114 may be adapted to couple to electrical traces 134 and route electrical signals (e.g., including electrical power) to and from snubber portion 130. In one embodiment, electrical traces 114 may be patterned (e.g., using various lithography techniques, for example) with electrical traces 134 and/or mechanical stabilizers 135 of snubber portion 130 from a single sheet of conductive material. In such embodiment, electrical traces 114 may be mated with ribbon films 112 and/or 116 prior to, during, or after the patterning process. A thickness and/or width of electrical traces 114 may be adapted according to a desired impendence of electrical traces 114, for example.

Although ribbon film 112 is shown in FIG. 1 as encompassing the width and breadth of ribbon portion 110, in other embodiments, ribbon film 112 (and/or ribbon film 116) may be patterned to substantially match individual profiles of electrical traces 114, for example, or according to other patterns. Such patterns may be used, in addition to and/or along with various stiffener materials (e.g., which may or may not be patterned similarly), to adjust an overall stiffness of flexible ribbon portion 110.

Also shown in FIG. 1 is snubber portion 130, which may include snubber film 132, one or more electrical traces 134, one or more mechanical stabilizers 135, one or more electrical contacts 138 and 139, and aperture 140. In various embodiments, snubber portion 130 may be adapted to route one or more electrical signals from ribbon portion 110 to electrical contacts 138, 139. In further embodiments, snubber portion 130 may be adapted to act as a snubber for adjacent structures (e.g., one or more optical MEMS structures) and inhibit and/or help inhibit motion of the adjacent structures through substantially constant and/or intermittent mechanical contact with the structures, as described herein. As such, snubber portion 130 may be implemented with various surface and side profiles to match an opposing surface of an adjacent structure.

In one embodiment, snubber portion 130 may be substantially planar, as shown in FIG. 1, and may be implemented to provide substantially aligned opposing flat surfaces to adjacent structures. Aperture 140 may be adapted to act as a circular optical aperture of a moveable lens module and/or a camera module, as described herein. In some embodiments, aperture 140 may have a circular shape, for example, or a square, rectangular, or oval shape in order to match a particular adjacent structure or optical aperture need, for example.

In one embodiment, snubber film 132 may be implemented with a suitable dielectric material, such as Mylar, Kapton, a fiber reinforced resin, an encapsulated foam, and/or other flexible, insulating, and/or snubbing materials, for example. In some embodiments, snubber film 132 may be implemented with a stiffener material added to at least a portion of snubber film 132 to provide mechanical stiffness for supporting an electrical connection disposed on any one of electrical contacts 138, 139, for example, or for providing a particular type of motion inhibition. In some embodiments, snubber film 132 may be patterned with ribbon film 112 from a single sheet of material. In related embodiments, additional material layers may be added to the portion of the sheet corresponding to snubber film 132 to adjust its stiffness, its type of snubber action, or a profile of any one of its surfaces (e.g., to provide a particular motion inhibition), as described herein. More generally, snubber film 132 may be implemented with one or more thicknesses that are greater than, the same as, or less than a thickness of ribbon film 112.

In further embodiments, snubber film 132 may be mated with snubber film 136 (e.g., shown in FIG. 2) to sandwich opposing sides of electrical traces 134 and/or mechanical stabilizers 135 in, for example, flexible, insulating, stiffening, snubbing, and/or otherwise protective material. Snubber film 136 may be formed, patterned, stiffened, or otherwise applied to snubber portion 130 using any one or combination of techniques described herein, and may or may not exhibit the same general characteristics of snubber film 132 (e.g., they may differ in material, thickness, stiffness, snubbing type, thermal and/or electrical conductivity, and in various other characteristics).

Although snubber film 132 is shown in FIG. 1 as encompassing the width and breadth of snubber portion 130, in other embodiments, snubber film 132 (and/or snubber film 136) may be patterned to substantially match individual profiles of electrical traces 134 and/or mechanical stabilizers 135, for example, or according to other patterns. Such patterns may be used, in addition to and/or along with various stiffener materials (e.g., which may or may not be patterned similarly), to adjust localized and/or overall stiffness, flexibility, and/or snubber type of snubber portion 130. For example, in one embodiment, one or more electrical traces 134 and/or mechanical stabilizers 135 may be embedded in snubber film 132, where at least a portion of a surface (e.g., a side, top, or bottom surface) of the embedded traces and/or stabilizers is attached to snubber film 132. In some embodiments, an electrical trace or mechanical stabilizer embedded in snubber film 132 may have portions of each of its surfaces that are not attached to snubber film 132 (e.g., where snubber film 132 comprises a web-like structure with strands that are smaller than one or more surfaces of the trace/stabilizer).

Electrical traces 134 may be implemented as a patterned conductive layer (e.g., a copper layer) deposited and/or otherwise formed or attached to snubber film 132 (e.g., and/or snubber film 136), as described herein. In various embodiments, electrical traces 134 may be adapted to couple electrically to electrical traces 114 and route electrical signals between electrical traces 114 and electrical contacts 138, 139. In additional embodiments, electrical traces 134 may be adapted to provide mechanical stabilization and/or snubbing to structures adjacent to snubber portion 130, similar to mechanical stabilizers 135, described herein. Thus, in some embodiments, electrical traces 134 may be adapted to provide both electrical distribution and mechanical stabilization, and, in various embodiments, may be interchangeable with mechanical stabilizers 135, such that only an electrical coupling with electrical traces 114 distinguishes electrical traces 124 from mechanical stabilizers 135. In some embodiments, electrical traces 134 may optionally be referred to as mechanical stabilizers.

In one embodiment, electrical traces 134 may be patterned (e.g., using various lithography techniques, for example) with mechanical stabilizers 135 from a single sheet of conductive material, such as a metal. In such embodiment, electrical traces 134 may be mated with snubber films 132 and/or 136 prior to, during, or after the patterning process. A thickness, width, profile, and/or pattern of electrical traces 134 may be adapted according to a desired impendence, a desired footprint or profile of an adjacent structure to be snubbed, and/or a type of snubbing action to be provided by electrical traces 134, for example.

Mechanical stabilizers 135 may be implemented as a patterned layer of material deposited and/or otherwise formed or attached to snubber film 132 (e.g., and/or snubber film 136), as described herein. In various embodiments, mechanical stabilizers 135 may be adapted to provide one or more surfaces for mechanically stabilizing and/or snubbing structures adjacent to snubber portion 130, as described herein. For example, each mechanical stabilizer 135 may have an individual thickness, shape, and/or profile adapted to inhibit motion of a particular adjacent structure (e.g., a MEMS actuator structure) in a particular way (e.g., to provide shock protection, hyperextension protection, and/or general stability), as described herein. In other embodiments, all mechanical stabilizers 135 may have the same thickness to help ensure overall tip/tilt alignment of adjacent structures and/or to facilitate camera module assembly convenience and/or reliability.

In various embodiments, mechanical stabilizers 135 may be implemented as a patterned conductive layer (e.g., a copper layer) deposited and/or otherwise formed or attached to snubber film 132 (e.g., and/or snubber film 136), as described herein. More generally, any one of mechanical stabilizers 134 may be implemented in a thermally and/or electrically conductive and/or non-conductive material, for example. For example, any one of mechanical stabilizers 134 may be adapted to thermalize or insulate adjacent structures and/or other portions of structure 100. In embodiments where mechanical stabilizers 135 are implemented in electrically conductive material, they may be adapted to couple electrically to electrical traces 113 and route electrical signals similar to related functions of electrical traces 134. Thus, in some embodiments, mechanical stabilizers 135 may be adapted to provide both electrical distribution and mechanical stabilization.

In one embodiment, mechanical stabilizers 135 may be patterned (e.g., using various lithography techniques, for example) with electrical traces 134 from a single sheet of conductive material, such as a metal. In such embodiment, mechanical stabilizers 135 may be mated with snubber films 132 and/or 136 prior to, during, or after the patterning process. In some embodiments, snubber portion 130 may additionally be implemented with a small set of electrical traces (not shown in FIG. 1) adapted to reduce a risk of charge build up on one or more of mechanical stabilizers 135. In related embodiments, one or more of mechanical stabilizers 135 may be electrically coupled to one of electrical traces 132 designated as an electrical ground.

Electrical contacts 138 and 139 may be adapted to route electrical signals to corresponding components of one or more adjacent structures, for example, such as one or more actuators of a moveable lens module, as described herein. In some embodiments, electrical contacts 138 and 139 may be implemented as one or more vias, solder pads, and/or electrical patches, for example, strategically located in areas that minimize additional wiring needed to electrically interface with one or more MEMS actuators. In one embodiment, electrical contacts 138 may be adapted to interface with an autofocus (AF) MEMS actuator, and electrical contacts 139 may be adapted to interface with an optical image stabilization (OIS) MEMS actuator, as described herein.

In some embodiments, where one or more of mechanical stabilizers 135 are electrically conductive (e.g., where electrical traces 134 and mechanical stabilizers 135 are substantially interchangeable), the number of electrical traces/electrically conductive mechanical stabilizers 134/135 may be equal to or greater than the number of electrical traces 114. In such embodiments, each one of electrical traces 114 may be coupled to at least one electrical trace/electrically conductive mechanical stabilizer 134/135. In some embodiments (e.g., where there are more electrical traces/electrically conductive mechanical stabilizers 134/135 than electrical traces 114) the remaining mechanical stabilizers may be implemented with a different thickness, for example, so as to mate with a particular profile of an adjacent structure, for example. In other embodiments, all traces and stabilizers may be the same thickness (e.g., when they are all patterned out of the same sheet of material, for example).

Figure 2:
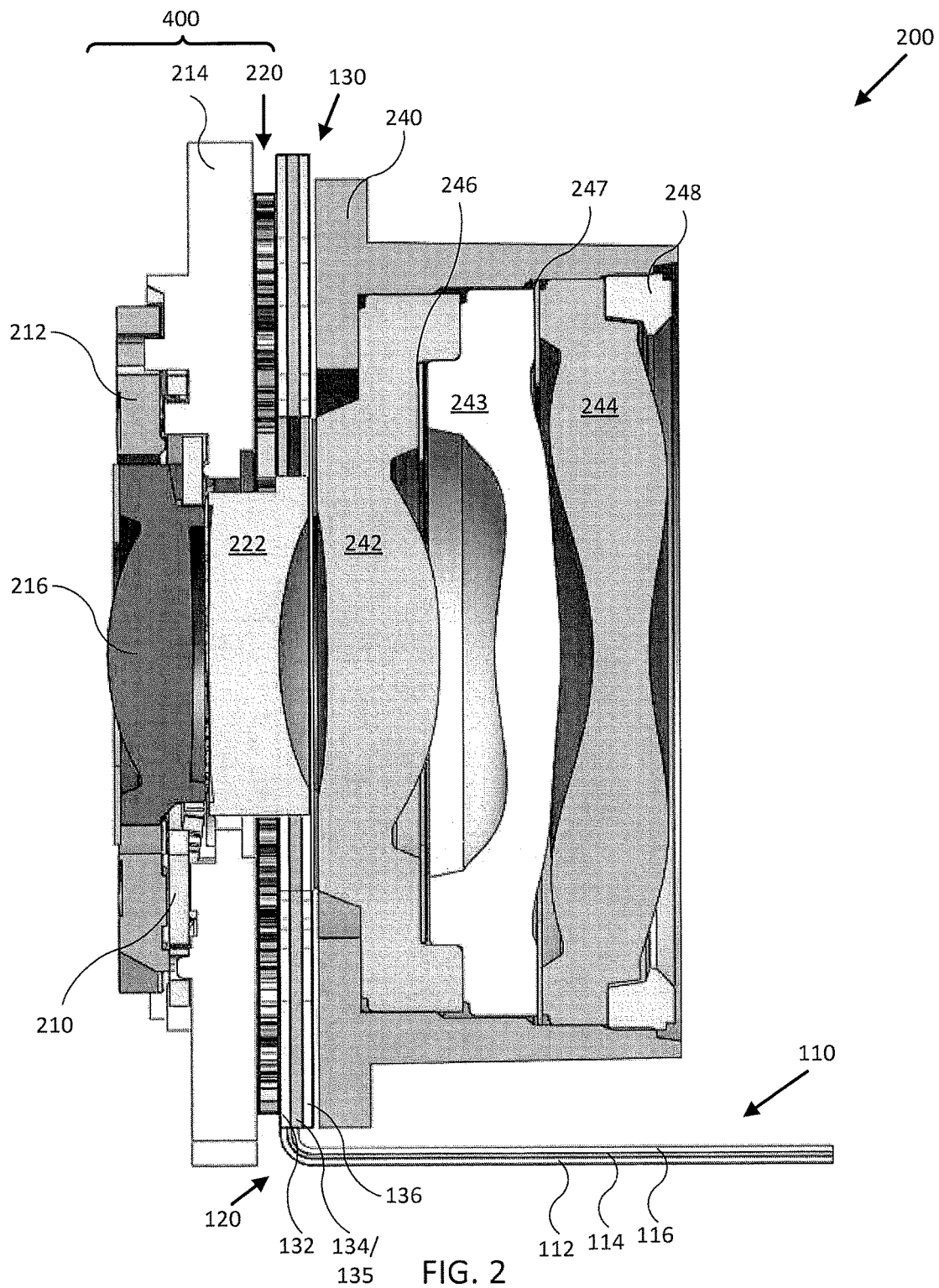
FIG. 2 illustrates a cross section view of a camera module including a flexible snubber structure in accordance with an embodiment of the disclosure.

FIG. 2 illustrates a cross section view of a camera module 200 including flexible snubber structure 100 (e.g., ribbon portion 110, folding portion 120, snubber portion 130) in accordance with an embodiment of the disclosure. In one embodiment, portions of camera module 200 may be implemented according to various techniques, structures, arrangements, and other methodologies set forth in U.S. patent application Ser. No. 13/216,225 filed Aug. 23, 2011, which is incorporated herein by reference in its entirety. In another embodiment, portions of camera module 200 (e.g., MEMS actuators 210 and/or 220) may be implemented according to various techniques, structures, arrangements, and other methodologies set forth in U.S. patent application Ser. No. 12/946,515 filed Nov. 15, 2010 which is incorporated herein by reference in its entirety. In another embodiment, portions of camera module 200 (e.g., MEMS actuators 210 and/or 220) may be implemented according to various techniques, structures, arrangements, and other methodologies set forth in U.S. patent application Ser. No. 13/247,898 filed Sep. 28, 2011 which is incorporated herein by reference in its entirety.

In the embodiment shown in FIG. 1, camera module 200 includes moveable lens module 400, lens barrel 240, and flexible snubber structure 100 (e.g., ribbon portion 110, folding portion 120, snubber portion 130) disposed substantially between moveable lens module 400 and lens barrel 240.

In one embodiment, moveable lens module 400 may be implemented as an assembly of AF MEMS actuator 210, lens 216, close focus snub 212, infinite focus snub 214, OIS MEMS actuator 220, and lens 222. In various embodiments, moveable lens module 400 may be adapted to transform electrical signals into motion of lenses 216 and/or 222 to focus, zoom, optically stabilize, or perform other optical processing techniques on light passing through moveable lens module 400. In one embodiment, AF MEMS 210 and OIS MEMS 220 may be adapted to operate and perform designated functions independently, for example, and in other embodiments, they may be adapted to operate and perform a variety of optical processing functions collaboratively. In further embodiments, AF MEMS 210 and OIS MEMS 220 may be implemented in a single monolithic MEMS actuator.

As shown in FIG. 2, close focus snub 212 may be adapted to inhibit motion of AF MEMS 210 and/or lens 216 when camera module 200 is imaging an object close to lens 216 (e.g., when an actuator structure of AF MEMS 210 and/or lens 216 is close to and/or contacting close focus snub 212), and infinite focus snub 214 may be adapted to inhibit motion of AF MEMS 210 and/or lens 216 when camera module 200 is imaging an object far from lens 216 (e.g., when an actuator structure of AF MEMS 210 and/or lens 216 is close to and/or contacting infinite focus snub 214). In addition, as can be seen from FIG. 2, infinite focus snub 214 may be adapted to help inhibit motion of one or more portions of OIS MEMS 220 and/or lens 222. In various embodiments, lens barrel 240 may be adapted to house and/or provide structural support for a variety of optical devices, including lenses 242-244 and/or associates spacers/snubbers 246-248.

Also shown in FIG. 2 are flexible ribbon portion 110, folding portion 1200, and snubber portion 130 of flexible snubber structure 100. As shown in FIG. 2, folding portion 120 allows flexible ribbon portion to follow a side profile of lens barrel 240 while providing various electrical signals over electrical traces 114 and insulated by ribbon films 112 and/or 116. Also as shown in FIG. 2, snubber portion 130 may include electrical traces 134/mechanical stabilizers 135 sandwiched between top snubber film 132 and bottom snubber film 136, each of which are thicker than electrical traces 114 and ribbon films 112, 116, respectively. As noted herein, each of electrical traces 134, mechanical stabilizers 135, top snubber film 132, and/or bottom snubber film 136 may be adapted to help inhibit motion (e.g., with help from infinite focus snub 214, in some embodiments) of an adjacent structure, such as one or more portions of OIS MEMS 220, lens 222, lens barrel 240, and/or lens 242.

In some embodiments, flexible snubber structure 100 and AF MEMS 210 and/or OIS MEMS 220 may be integrated with lenses 212 and 222 to form a moveable lens module (e.g., moveable lens module 400) including flexible snubber structure 100, as described herein. In further embodiments, moveable lens module 400 including flexible snubber structure 100 may be coupled to and/or integrated with lens barrel 240 and various optical devices (e.g., lenses 242-244, spacers/snubbers 246-248, various irises, shutters, filters, and other optical devices) structurally supported by lens barrel 240 to form camera module 200. Camera module 200 can be integrated with (e.g., electrically coupled to, soldered to, mechanically coupled to) a digital camera, a smartphone, a personal digital assistant, a tablet computer, a notebook computer, a kiosk (e.g., a sales kiosk, an ATM, and/or other types of kiosks), a portable electronic device, and/or other electronic devices, for example.

Figure 3:
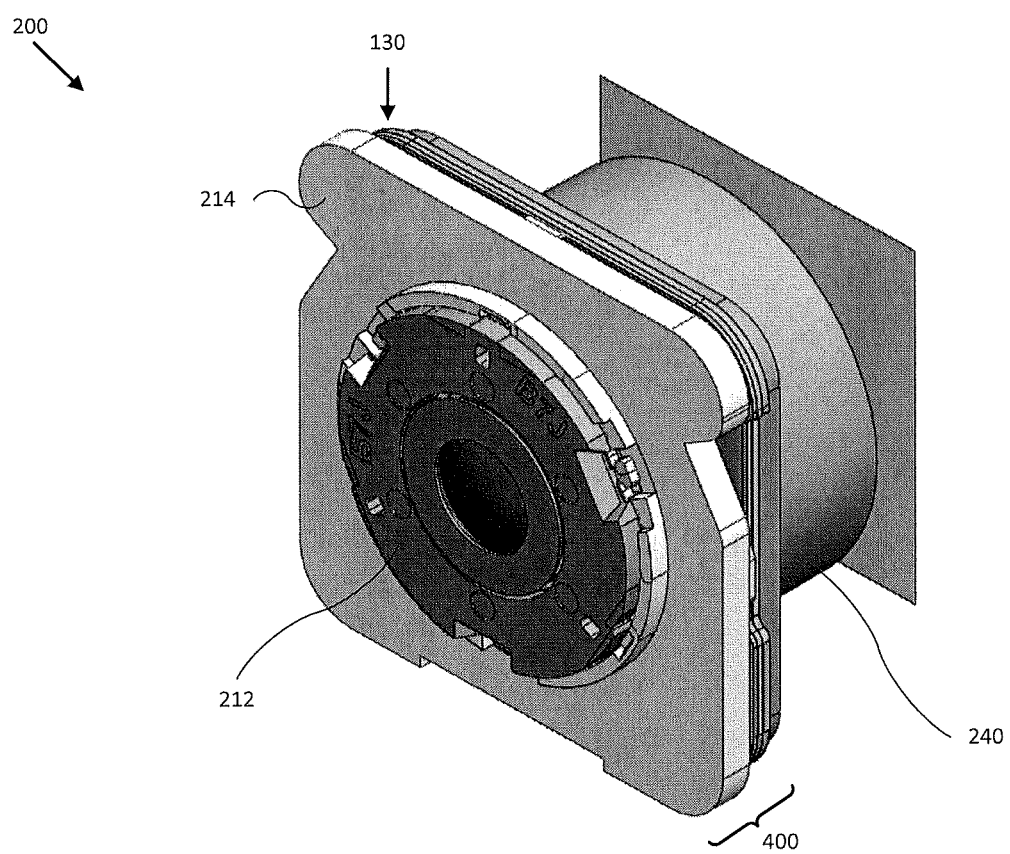
FIG. 3 illustrates a perspective view of the camera module in FIG. 2 in accordance with an embodiment of the disclosure.

FIG. 3 illustrates a perspective view of the camera module in FIG. 2 in accordance with an embodiment of the disclosure. As shown in FIG. 3, elements of camera module 200 may be arranged relatively compactly utilizing the electrical distribution and snubbing features of flexible snubber structure 100. For example, in contrast to various electrical leads and spacers servicing various MEMS actuators and lenses contained within the spaces between close focus snub 212 and infinite focus snub 214, infinite focus snub 214 and snubber portion 130, and between snubber 130 and lens barrel 240, embodiments of the present disclosure supply all such leads and at least a portion of the snubbing action through application of ribbon portion 110, folding portion 120, and snubber portion 130 of flexible snubber structure 100.

Figure 4:
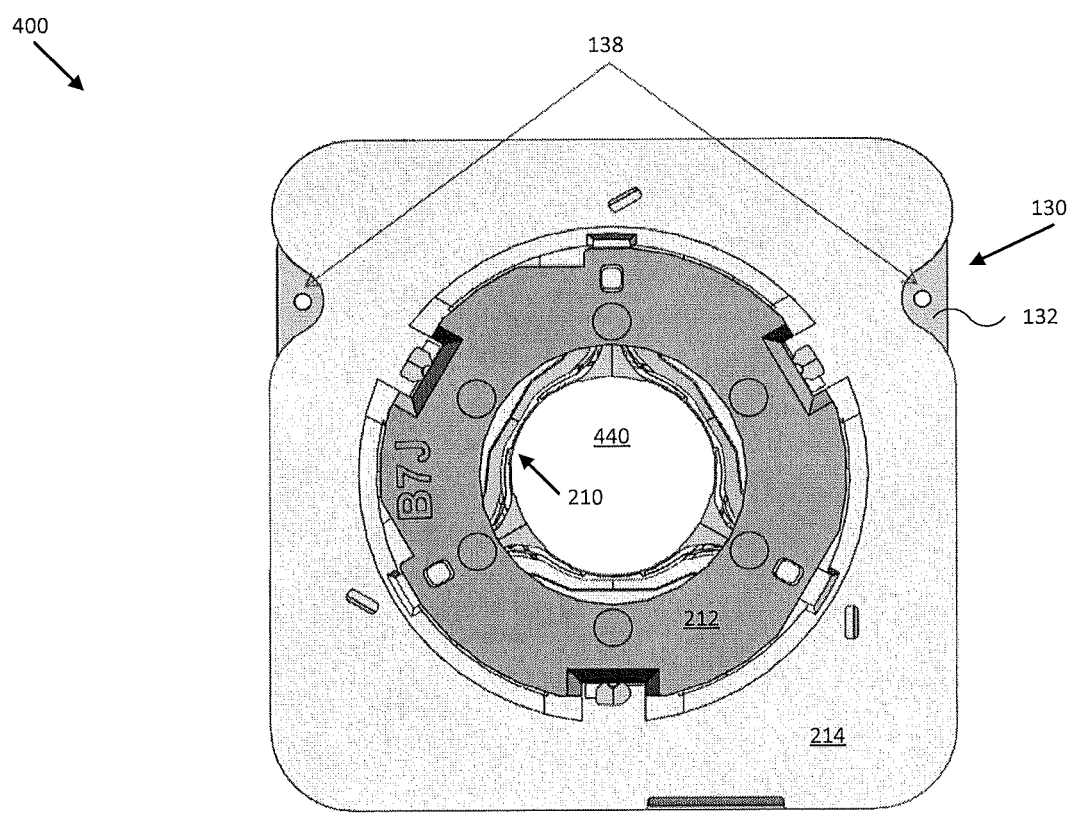
FIG. 4 illustrates a first plan view of a moveable lens module including a flexible snubber structure in accordance with an embodiment of the disclosure.

FIG. 4 illustrates a first plan view of moveable lens module 400 including snubber portion 130 of flexible snubber structure 100 in accordance with an embodiment of the disclosure. As shown in FIG. 4, strategic placement of electrical contacts 138 accessible through snubber film 132 of snubber portion 130 provide simplified routing of electrical signals to, for example, AF MEMS actuator 210 disposed substantially between close focus snub 212 and infinite focus snub 214. In some embodiments, aperture 440 may be substantially defined by aperture 140 in snubber portion 130, for example.

Figure 5:
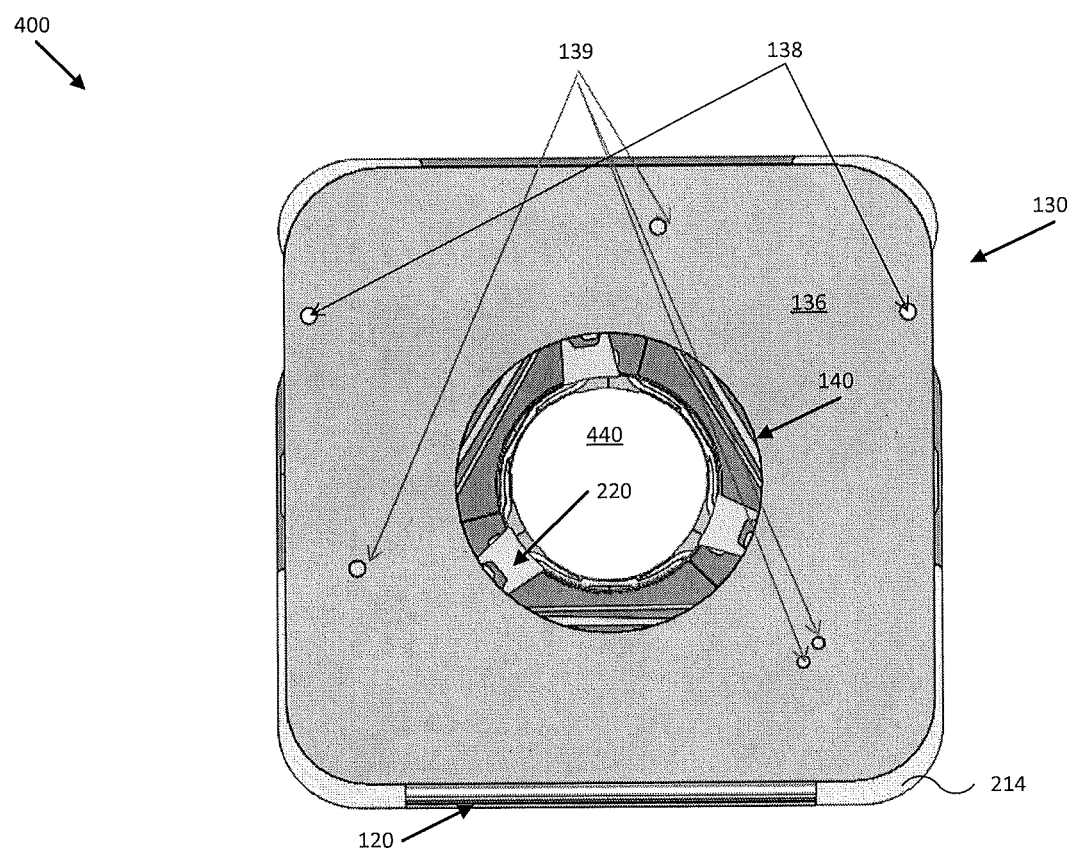
FIG. 5 illustrates a second plan view of the moveable lens module in FIG. 4 in accordance with an embodiment of the disclosure.

FIG. 5 illustrates a second plan view of moveable lens module 400 including folding portion 120 and snubber portion 130 of flexible snubber structure 100 in accordance with an embodiment of the disclosure. It should be appreciated that both electrical contacts 138 and 139 are typically only visible from the bottom view presented in FIG. 5 when snubber film 136 is substantially transparent. Their placement is provided in FIG. 5 for clarity of description. As shown in FIG. 5, strategic placement of electrical contacts 139 accessible through snubber film 132 (e.g., shown in FIGS. 1, 2 and 4) of snubber portion 130 provide simplified routing of electrical signals to, for example, OIS MEMS actuator 220 disposed substantially between infinite focus snub 214 and snubber portion 130 of flexible snubber structure 100. In some embodiments, aperture 440 may be substantially defined by aperture 140 in snubber portion 130, for example. In other embodiments, such as that shown in FIG. 5, aperture 140 may provide for OIS movement of lens 222 in FIG. 2.

Figure 6:
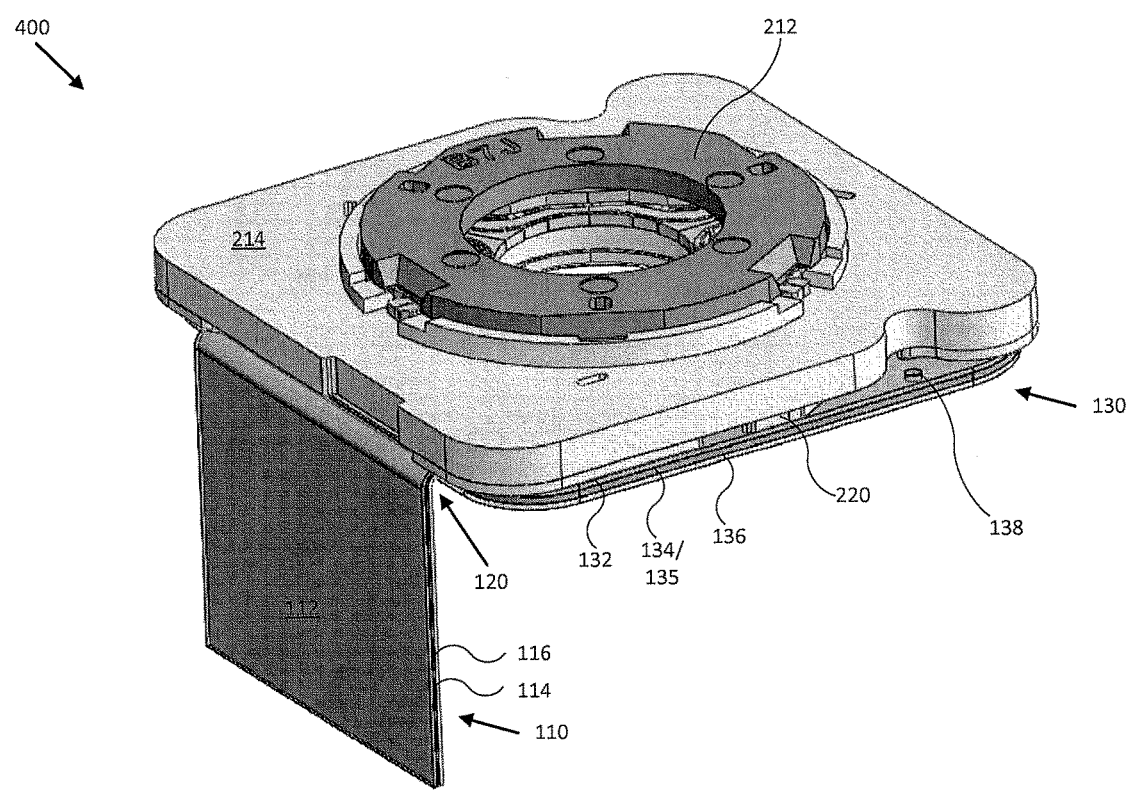
FIG. 6 illustrates a perspective view of the moveable lens module in FIGS. 4 and 5 in accordance with an embodiment of the disclosure.

FIG. 6 illustrates a perspective view of moveable lens module 400 including ribbon portion 110, folding portion 120 and snubber portion 130 of flexible snubber structure 100 in accordance with an embodiment of the disclosure. As shown in FIG. 6, snubber film 132 is substantially disposed on a top side of electrical traces/mechanical stabilizers 134/135 and between electrical traces/mechanical stabilizers 134/135 and OIS MEMS 220, snubber film 136 is substantially disposed on a bottom side of electrical traces/mechanical stabilizers 134/135, and each of snubber film 132, snubber film 136, and electrical traces/mechanical stabilizers 134/135 may be adapted to inhibit mechanical motion of OIS MEMS 220 (e.g., with the help of lens barrel 240).

Figure 7:
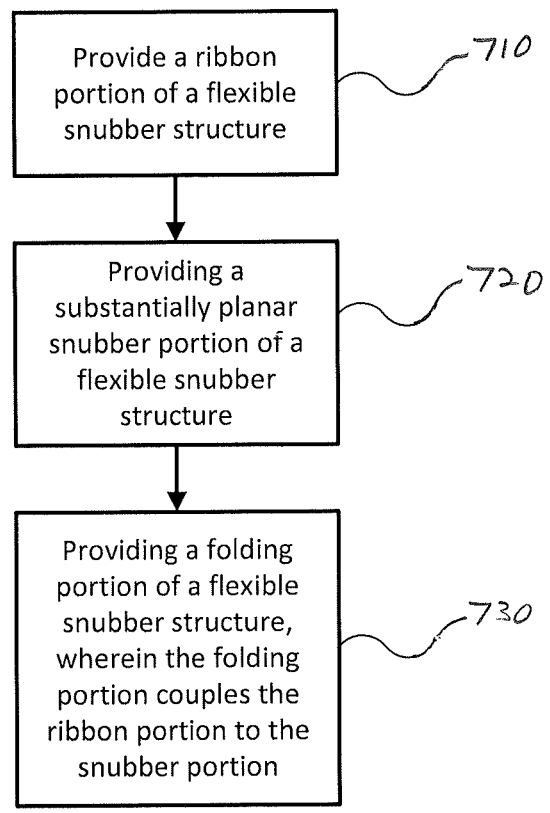
FIG. 7 illustrates a flow diagram of various operations to provide actuator motion control in accordance with an embodiment of the disclosure.

FIG. 7 illustrates a flow diagram of process 1000 to provide actuator motion control in accordance with an embodiment of the disclosure. In some embodiments, the operations of process 1000 may be implemented as software instructions executed by one or more logic devices used to implement a fabrication and/or assembly process. More generally, the operations of process 1000 may be implemented with any combination of software instructions, electronic hardware (e.g., inductors, capacitors, amplifiers, or other analog and/or digital components), and/or mechanical hardware used in a fabrication and/or assembly process, such as a MEMS fabrication process, for example, and/or a semiconductor fabrication process.

It should be appreciated that any step, sub-step, sub-process, or block of process 1000 may be performed in an order or arrangement different from the embodiment illustrated by FIG. 7. Further, in some embodiments, any number of processes similar to process 1000 may be performed substantially simultaneously to produce multiple instances of flexible snubber structures throughout a camera module, for example. Although process 1000 is described with reference to system 100, process 1000 may be performed according to systems different from system 100 and including a different selection of electrical, optical, structural, and/or snubber requirements.

In block 710, a flexible snubber structure assembly process includes providing a ribbon portion of a flexible snubber structure. For example, in one embodiment, a fabrication and/or assembly system may be adapted to provide flexible ribbon portion 110 by forming electrical traces 114 and then applying flexible ribbon film 112, where electrical traces 114 are at least partially electrically insulated by ribbon film 112.

In some embodiments, ribbon film 112 may be formed from one or more dielectric materials (e.g., glass, ruby, various polymers, Mylar, Kapton, a fiber reinforced resin, other flexible materials, and/or stiffeners), using a variety of depositing, painting, growing, patterning, shaping, molding, casting, or other film formation techniques, and/or other fabrication processes, for example. In additional embodiments, electrical traces 114 may be formed from one or more conductive materials (e.g., metal foils, strips, wires, braids, and/or other flexible conductive materials), using a variety of depositing, growing, patterning, shaping, molding, casting, extruding, or other conductive trace formation techniques, and/or other fabrication processes, for example.

In various embodiments, block 710 may be performed substantially simultaneously with process steps used to form other portions of flexible snubber structure 100 and/or provide other flexible snubber structures, for example. In some embodiments, block 710 may be implemented to produce ribbon portion 110 according to a particular desired flexibility.

In block 720, a flexible snubber structure assembly process includes providing a substantially planar snubber portion of a flexible snubber structure. For example, in one embodiment, a fabrication and/or assembly system may be adapted to provide snubber portion 130 by forming electrical traces 134 and/or mechanical stabilizers 135 and then applying snubber film 132, and/or forming electrical contacts 138, 139 and/or aperture 140, where electrical traces 134 and/or mechanical stabilizers 135 are embedded in snubber film 132.

In some embodiments, snubber film 132 may be formed from one or more dielectric materials (e.g., glass, ruby, various polymers, Mylar, Kapton, a fiber reinforced resin, an encapsulated foam, other flexible materials, stiffeners, and/or thermally conductive materials), using a variety of depositing, painting, growing, patterning, shaping, molding, casting, or other film formation techniques, and/or other fabrication processes, for example. In additional embodiments, electrical traces 134 may be formed from one or more conductive materials (e.g., metal foils, strips, wires, braids, and/or other flexible conductive materials), using a variety of depositing, growing, patterning, shaping, molding, casting, extruding, or other conductive trace formation techniques, and/or other fabrication processes, for example.

In further embodiments, mechanical stabilizers 135 may be formed from any of the materials used to form ribbon film 112, snubber film 132, and/or electrical traces 134, for example, using any of the various material formation techniques and/or other fabrication processes described herein. In still further embodiments, electrical contacts 138, 139 may be formed in or on electrical traces 134, and aperture 140 may be formed in snubber portion 130, using a variety of stripping, soldering, drilling, punching, or other electrical contact and/or aperture formation techniques and/or other fabrication processes, for example.

In various embodiments, block 720 may be performed substantially simultaneously with process steps used to form other portions of flexible snubber structure 100 and/or provide other flexible snubber structures, for example. In some embodiments, block 720 may be implemented to produce snubber portion 110 according to a particular desired shape, profile, footprint, thickness, flexibility, stiffness, electrical contact pattern, stability and/or snubbing pattern.

In block 730, a flexible snubber structure assembly process includes providing a folding portion of a flexible snubber structure. For example, in one embodiment, a fabrication and/or assembly system may be adapted to provide folding portion 120 by coupling electrical traces 114 of ribbon portion 110 to electrical traces/mechanical stabilizers 134/135 of snubber portion 130. In one embodiment, at least one of electrical traces 134 is functionally interchangeable with one of mechanical stabilizers 125, for example, as long as the particular mechanical stabilizer is electrically conductive.

In some embodiments, such electrical coupling may be made through use of a variety of welding, soldering, pressing, conductive adhesives, or other electrical coupling techniques, and/or other fabrication processes, for example. In additional embodiments, block 730 may include coupling ribbon film 112 to snubber film 132 and/or ribbon film 116 to snubber film 136. Such coupling can be made through use of a variety of crimping, adhesives, melting, welding, or other material coupling techniques and/or other fabrication processes, for example.

In various embodiments, block 730 may be performed substantially simultaneously with process steps used to form other portions of flexible snubber structure 100 and/or provide other flexible snubber structures, for example. In some embodiments, block 730 may be implemented to produce folding portion 120 according to a particular desired shape, profile, footprint, thickness, flexibility, stiffness, electrical contact pattern, stability and/or folding pattern.

In additional embodiments, a fabrication and/or assembly system may be adapted to provide flexible snubber structure 100 from various relatively large sheets of materials that are common to ribbon portion 110, folding portion 120, and snubber portion 130. For example, ribbon film 112 and snubber film 132 may be patterned from the same sheet of material so that they form a single piece of film for all three portions of flexible snubber structure 100. Similarly, electrical traces 114 and electrical traces/mechanical stabilizers 134/135 may all be patterned from a single sheet of conductive material (e.g., copper foil). Such fabrication techniques substantially simplify and reduce the cost of fabrication of flexible snubber structure 100.

In some situations, one or more lens stack tolerances may be reduced or eliminated in certain embodiments by mounting an actuator having one more movable lenses directly to a surface of an outermost lens in a lens barrel, thereby allowing for greater accuracy in the airspace between optical surfaces such as between two lens surfaces. The outermost lens in the lens barrel may be mounted within the lens barrel and may have a mounting surface and/or an optical surface that protrude from the lens barrel to facilitate external mounting of the actuator or a movable lens group containing one or more movable lenses and one or more actuators to the lens surface.

Figure 8:
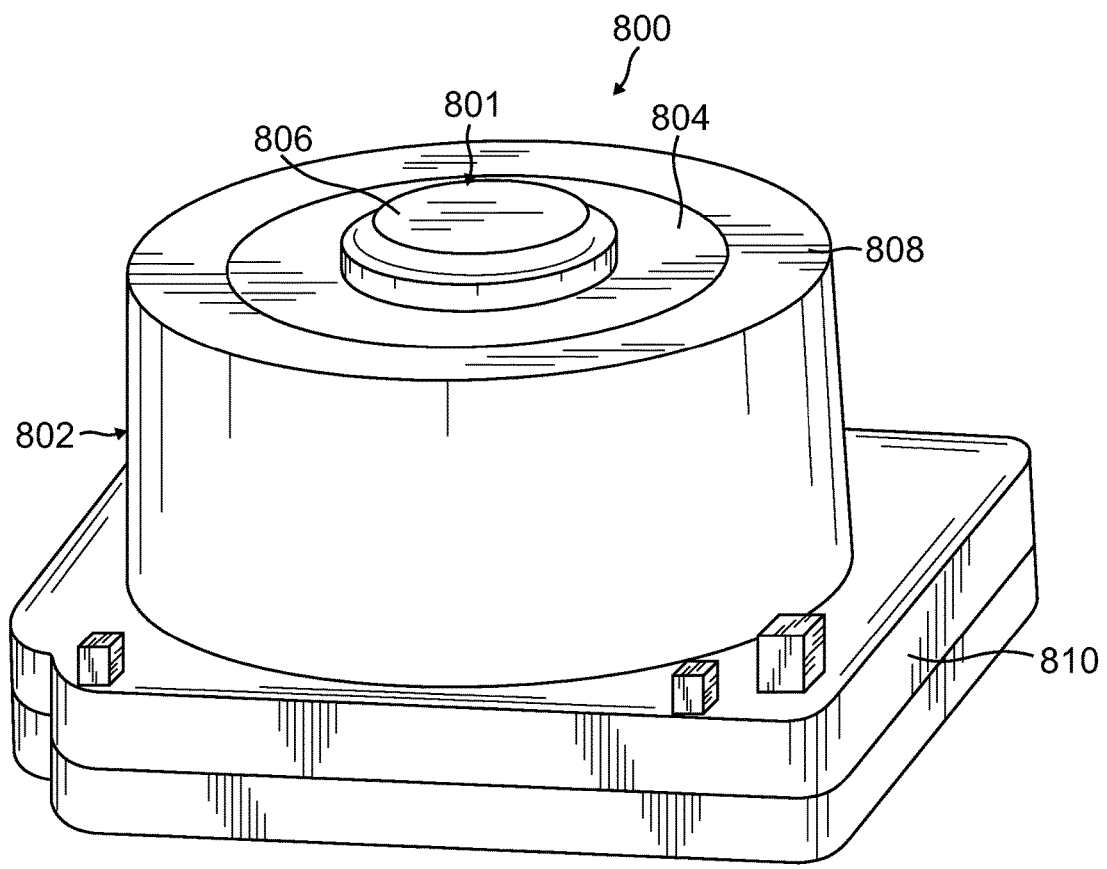
FIG. 8 illustrates a perspective view of a lens barrel that has a number of lenses of an optical assembly of a camera module contained therein in accordance with an embodiment of the disclosure.

FIG. 8 illustrates a perspective view of a camera module 800 having a lens barrel 802 that has a number of lenses of an optical assembly of the camera module contained therein in which a mounting surface 804 and an optical surface 806 of an outermost lens 801 within the lens barrel is shown, in an example embodiment, protruding from the lens barrel 802. The mounting surface 804 of lens 801 in the embodiment illustrated by FIG. 8 has a ring shape. An optical surface 806 of lens 801 is shown in FIG. 8 radially disposed inside the mounting surface 804. Another ring 808 is shown in FIG. 8 radially disposed outside the mounting surface 804 of lens 801 which includes a wall of the lens barrel 802. The mounting surface 804 is configured in certain embodiments to accept, couple with or attach to a MEMS actuator or a MEMS-actuated device or MEMS actuated movable lens or lens group. In one exemplary embodiment, movable lens module 400 or one of the actuators 210 or 220 of movable lens module 400 of FIG. 2 may be mounted to mounting surface 804.

Figure 9:
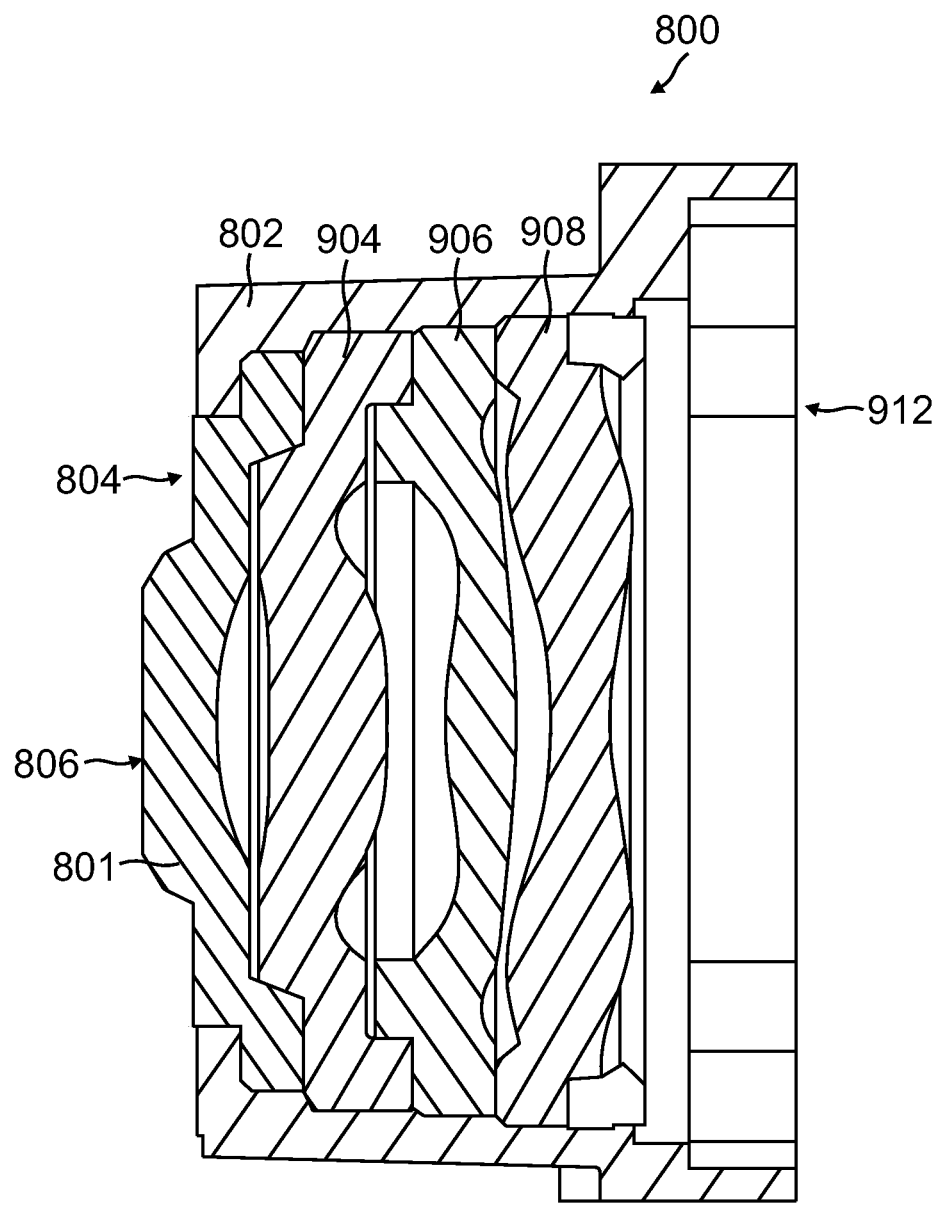
FIG. 9 illustrates a cross-sectional view of a lens barrel containing four lenses of an optical assembly of a camera module in accordance with an embodiment of the disclosure.

FIG. 9 illustrates a cross sectional view of lens barrel 802 containing four lenses 801, 904, 906, and 908 of an optical assembly of camera module 800. The camera module may, when assembled, include a MEMS actuator with one or more movable lens groups that includes a single movable lens or more than one movable lens. In the illustration of FIG. 9, just as with that of FIG. 8, the MEMS component is not yet attached. Lenses 801, 904, 906, and 908 are shown in FIG. 9. In an assembled camera module, an image sensor may be coupled to the lens barrel and may have an active image sensor area disposed at a focal plane of the camera module or at a plane that corresponds to a focal plane of the device for at least one position of the movable optic within an autofocus range of the camera module.

As shown in FIGS. 8 and 9, lens barrel surface 808 lies in a plane that is normal to the optical path and that is closer to the image sensor side 912 of lens barrel 802 than a plane within which mounting surface 804 lies.

Depending on the optical power of the lens 801, the optical surface 806 of the lens 801 that is furthest from the image sensor may be closer to or further from the image sensor than the mounting surface of the lens 801. In FIG. 9, the optical surface 806 of lens 801 includes in certain embodiments a convex surface that is further from the image sensor than either the mounting surface or a concave inner optical surface of the lens 801. The optical surface 806 of lens 801 may be concave, and/or may be closer to the image sensor than the mounting surface of lens 801 whether it has a convex, concave, meniscus, spherical, aspherical, linear, nonlinear, simple or complex shape.

Figure 10:
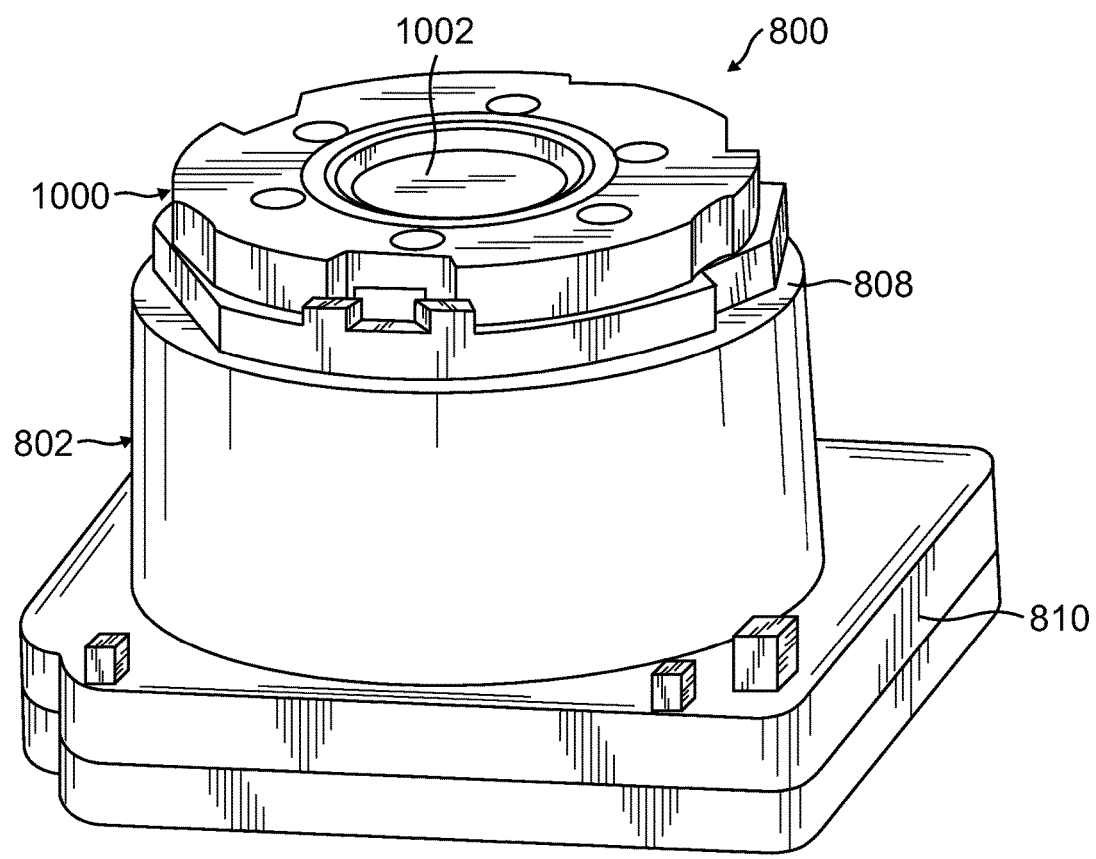
FIG. 10 illustrates a perspective view of a lens barrel for a camera module including a MEMS actuator that is configured to move at least a first lens and that is coupled onto the mounting surface of a second lens in accordance with an embodiment of the disclosure.
Figure 11:
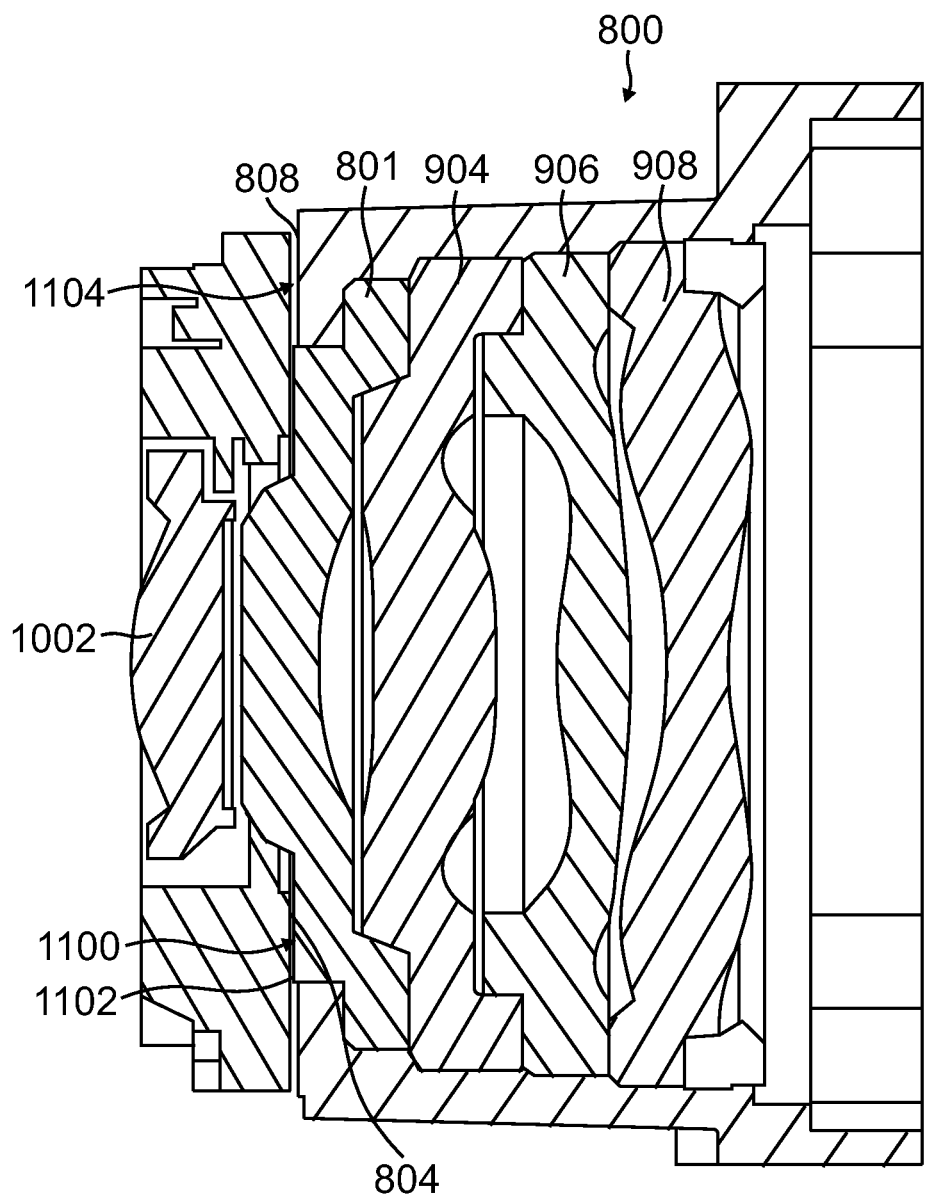
FIG. 11 illustrates a cross-sectional view of a lens barrel for a camera module including a MEMS actuator that is configured to move at least a first lens and that is coupled onto the mounting surface of a second lens in accordance with an embodiment of the disclosure.

FIG. 10 illustrates a perspective view and FIG. 11 illustrates a cross-sectional view of camera module 800 including the configuration illustrated at FIGS. 8 and 9 and also including a MEMS actuator 1000 that is configured to move a single lens 1002 and that is coupled onto the mounting surface of lens 801. The mounting surface 804 of lens 801 is shown contacting a portion of MEMS surface 1102 at interface 1100, however, in some embodiments, there may be a spacer, aperture, or other optical, mechanical and/or electrical material (e.g., snubber) structure between the two surfaces 1102 and 804.

A space 1104 is shown between the lens barrel ring surface 808 and another portion of outer MEMS surface 1102 within which an adhesive may be applied to fix the MEMS structure 1000 to the lens barrel 802 following an active alignment process or step. The spacing may be defined wholly or partly around the MEMS/lens 801 outer periphery wherein adhesive may be applied wholly or partly around that periphery. In the example of FIG. 11, the mounting surface 804 of lens 801 is closer to the MEMS surface 1102 inside the outer periphery to which adhesive is applied. UV curing may be used to cure adhesive disposed in space 1104, thereby attaching MEMS structure 1000 to lens barrel 802. In certain embodiments, the mounting surface 804 may directly contact the MEMS surface 1102 in one or more places.

In some embodiments, there may be one or more passive alignment features included in camera module 800. For example, the arrangement shown in FIG. 11 illustrates lenses 801, 904 and 906 having shapes that provide some passive alignment as to centering alignment. Lens 908 is disposed proximate the image sensor and aligned in part by passive alignment features shown at the outermost radial distance of the lens 908.

Advantageously, the tolerances of the lens barrel housing may be relaxed due to the mounting surface 804 of lens 801 receiving the MEMS counterpart rather than the top of the lens barrel wall. In certain embodiments, a slight decenter may be used to compensate for a slight tilt misalignment.

In certain embodiments, two lens groups G1 and G2 are assembled, wherein group G1 includes the MEMS actuator 1000 coupled with the lens 1002, and group G2 includes lenses 801, 904, 906, and 908, an image sensor and a lens barrel. When assembled, the MEMS autofocus camera module may be coupled to a flexible printed circuit. The image sensor may be used to capture images responsive to light received along an optical path through lenses 1002, 801, 904, 906, and 908 in which lens 1002 has been focused by operating actuator 1000 to move lens 1002 relative to the image sensor and/or lenses 801, 904, 906, and 908.

Figure 12:
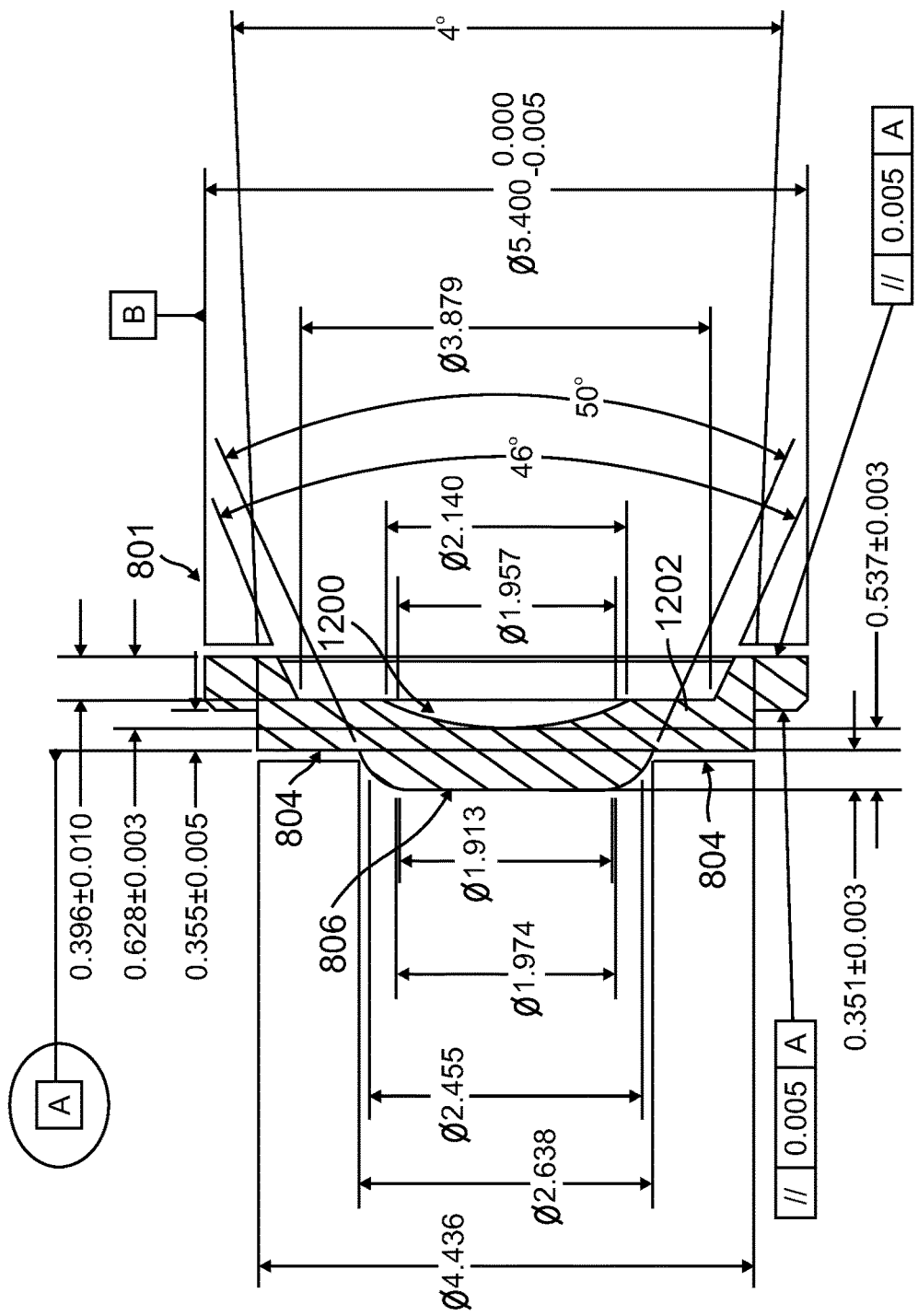
FIG. 12 illustrates a schematic representation of a lens in side view having a mounting surface configured to couple to an actuator in accordance with an embodiment of the disclosure.

FIG. 12 illustrates a schematic representation of lens 801 in side view. As shown, the lens 801 has a convex design in the example of FIG. 12. The left-most surface 806 in FIG. 12 may be closer to the object end of the camera module in certain embodiments than the inner surface 1200 of lens 801. The left-most surface 806 in FIG. 12 is configured to couple with a MEMS actuator such as MEMS actuator 1000 that is configured to move lens 1002 along the optical path relative to lens 801 within an autofocus range of the camera module.

Lens 801 may in certain embodiments be thicker generally in a radial range that includes the mounting surface than at greater radii. This further reduces tolerance build up. The mounting surface 804 in the example of FIG. 12 is what the data "A" refer to. Various other relative dimensions and representative angles are shown for lens 801 if FIG. 12. However, it should be appreciated that these relative dimensions and representative angles are merely illustrative and other dimensions, shapes, and angles may be used as would be understood by one skilled in the art to provide an outermost lens arranged to be mounted within a lens barrel and having a mounting surface arranged to be coupled to an actuator.

Figure 13:
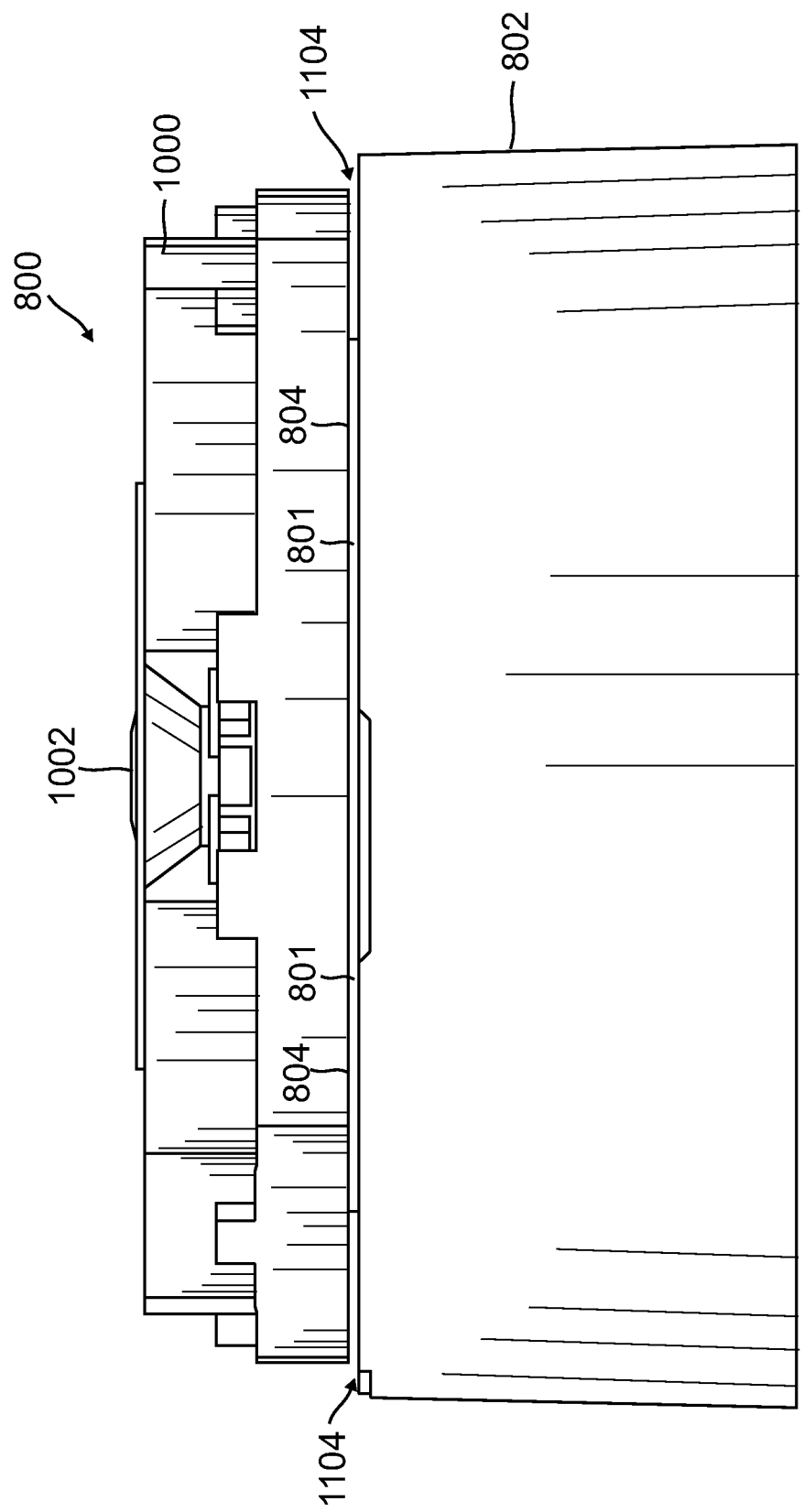
FIG. 13 illustrates a side view of a camera module optical assembly in accordance with an embodiment of the disclosure.

FIG. 13 illustrates the camera module 800 of FIG. 10 in side view. The mounting surface 804 and a small thickness of lens 801 beneath the mounting surface are visible in FIG. 13 as protruding from the lens barrel 802. The MEMS actuator 1000 with lens 1002 coupled therewith is illustrated in FIG. 12 wholly external to the lens barrel 802. The protrusion of the mounting surface 804 of lens 801 from the lens barrel 802 permits the MEMS actuator 1000 to mount onto the mounting surface 804 of lens 801 leaving the gap 1104 between the lens barrel outer wall and the MEMS actuator within which adhesive may be applied.

A MEMS actuator may be placed on the mounting surface of lens 801 and actively aligned with the rest of the optical assembly of the camera module. Then, the MEMS actuator may be glued and cured to fix the MEMS actuator into position within the camera module.

Figure 14:
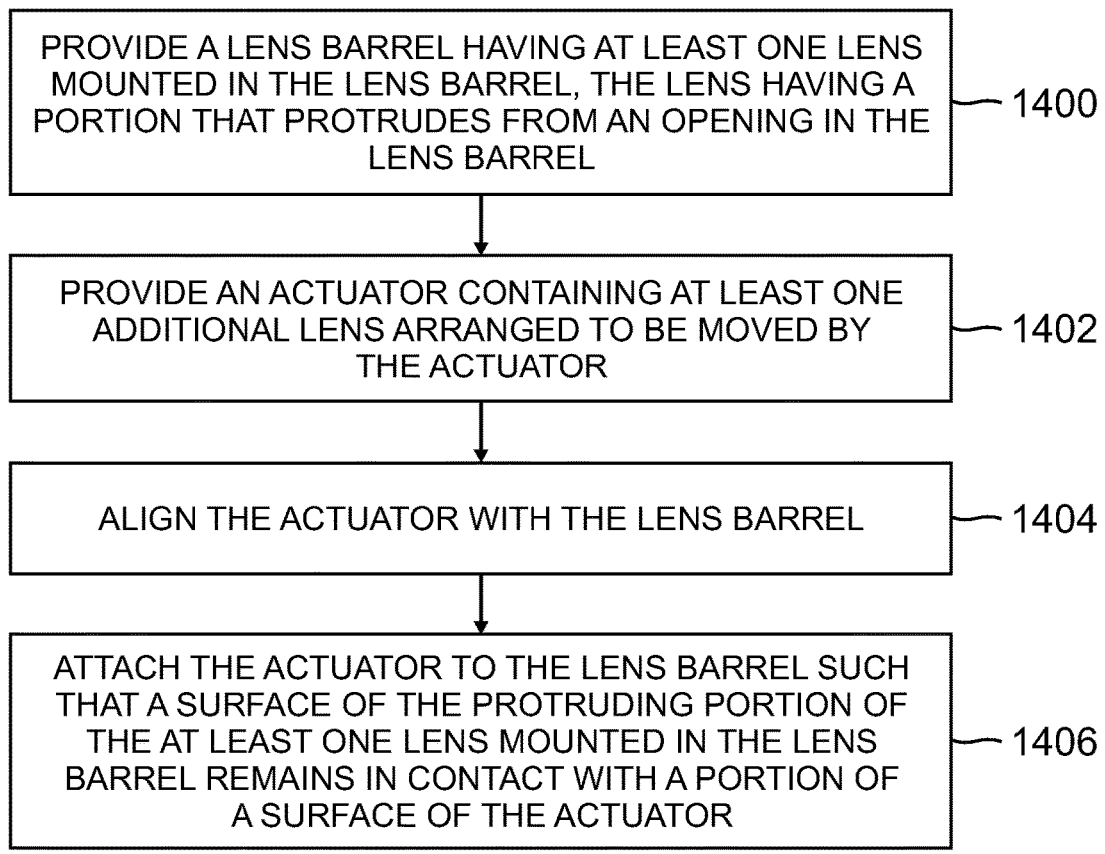
FIG. 14 illustrates a flow diagram of various operations to provide a camera module having an actuator coupled to a lens that protrudes from a lens barrel in accordance with an embodiment of the disclosure.

FIG. 14 shows an illustrative process for making a camera module such as camera module 800.

At block 1400, a lens barrel having at least one lens mounted in the lens barrel may be provided, the lens having a portion that protrudes from an opening in the lens barrel. The portion that protrudes from the opening may include a mounting surface of the lens mounted within the lens barrel.

At block 1402, an actuator such as a MEMS actuator or other actuator (e.g., a piezoelectric or voice coil motor actuator) containing at least one additional lens arranged to be moved by the actuator may be provided. As examples, actuator 1000 of FIGS. 10, 11, and 13, actuator 210, actuator 220, or movable lens module 400 having multiple actuators and movable lenses may be provided.

At block 1404, the actuator may be aligned with the lens barrel. For example, a MEMS actuator may be placed on the mounting surface of the lens within the lens barrel and the lens within the actuator may be actively aligned with the rest of the optical assembly (e.g., with one or more lenses within the lens barrel).

At block 1406, the actuator may be attached to the lens barrel such that a portion of a surface of the actuator remains in contact with the mounting surface (or an intervening structure such as a spacer) when the actuator is attached to the lens barrel. Attaching the actuator to the lens barrel may include providing an adhesive into a gap between a surface of the lens barrel and an opposing portion of the surface of the actuator and curing the adhesive.

In addition, all references cited above and below herein, the background, abstract and brief description of the drawings, U.S. patent application Ser. Nos. 13/931,978, 13/888,363, 13/789,608, 13/789,603, 13/789,594, 13/726,527, 13/710,430, 13/445,857, 13/571,395, 13/571,405, 13/571,397, 13/571,393, 12/213,472, 12/225,591, 12/289,339, 12/774,486, 13/026,936, 13/026,937, 13/036,938, 13/027,175, 13/027,203, 13/027,219, 13/051,233, 13/163,648, 13/264,251, and 61/698,567, PCT application WO2007/110097, and U.S. Pat. No. 6,873,358, and RE42,898 are each incorporated by reference into the detailed description of the embodiments as disclosing alternative embodiments.

The following patents are also incorporated by reference as disclosing alternative embodiments: U.S. Pat. Nos. 8,055,029, 7,855,737, 7,995,804, 7,970,182, 7,916,897, 8,081,254, 7,620,218, 7,995,855, 7,551,800, 7,515,740, 7,460,695, 7,965,875, 7,403,643, 7,916,971, 7,773,118, 8,055,067, 7,844,076, 7,315,631, 7,792,335, 7,680,342, 7,692,696, 7,599,577, 7,606,417, 7,747,596, 7,506,057, 7,685,341, 7,694,048, 7,715,597, 7,565,030, 7,636,486, 7,639,888, 7,536,036, 7,738,015, 7,590,305, 7,352,394, 7,564,994, 7,315,658, 7,630,006, 7,440,593, 7,317,815, and 7,289,278.

The following patent applications are also incorporated by reference as disclosing alternative embodiments: U.S. patent application Ser. Nos. 13/306,568, 13/282,458, 13/234,149, 13/234,146, 13/234,139, 13/220,612, 13/084,340, 13/078,971, 13/077,936, 13/077,891, 13/035,907, 13/028,203, 13/020,805, 12/959,320, 12/944,701 and 12/944,662

The following published patent applications are also incorporated by reference as disclosing alternative embodiments: United States Patent Publications Nos. US20120199857, US20120019614, US20120019613, US20120008002, US20110216156, US20110205381, US20120007942, US20110141227, US20110002506, US20110102553, US20100329582, US20110007174, US20100321537, US20110141226, US20100141787, US20110081052, US20100066822, US20100026831, US20090303343, US20090238419, US20100272363, US20090189998, US20090189997, US20090190803, US20090179999, US20090167893, US20090179998, US20080309769, US20080266419, US20080220750, US20080219517, US20090196466, US20090123063, US20080112599, US20090080713, US20090080797, US20090080796, US20080219581, US20090115915, US20080309770, US20070296833 and US20070269108.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A method of making a camera module, the method comprising:
providing a lens barrel having at least one lens fixably coupled to the lens barrel, the lens having a top peripheral region;
providing an actuator containing at least one additional lens arranged to be moved by the actuator;
moving a portion of a surface of the actuator into contact with the top peripheral region of the lens fixably coupled to the lens barrel; and
fixing the actuator with respect to the lens barrel such that the portion of the surface of the actuator remains in contact with the top peripheral region of the lens that is fixably coupled to the lens barrel.

2. The method of claim 1, wherein the top peripheral region comprises a mounting surface of the lens that is disposed perpendicular to an optical axis of the lens.

3. The method of claim 1, wherein the actuator comprises a microelectromechanical systems (MEMS) actuator and wherein that at least one additional lens comprises an autofocus lens for a camera module.

4. The method of claim 1, wherein the actuator comprises a movable lens module comprising:
an autofocus actuator;
an autofocus lens mounted to the autofocus actuator;
an optical image stabilization actuator; and
an optical image stabilization lens mounted to the optical image stabilization actuator.

5. The method of claim 1, further comprising, prior to the fixing, aligning the actuator with the lens barrel.

6. The method of claim 1, wherein the fixing comprises:
providing an adhesive into a gap between a surface of the lens barrel and an opposing portion of the surface of the actuator; and
curing the adhesive.

7. The method of claim 1, further comprising:
integrating the camera module into a digital camera, a smartphone, a personal digital assistant, a computer, a tablet or notebook computer, a kiosk, or a portable electronic device.

8. A camera module comprising:
a lens barrel having a first end and a second end;
a first lens fixed with respect to said lens barrel proximate said first end of said barrel, said first lens having an optical surface and a mounting surface;
an image sensor fixed proximate said second end of said barrel; and
an actuator assembly including a second lens and a mounting surface, said actuator assembly being configured to move said second lens along an optical axis passing through said first lens; and wherein
said mounting surface of said actuator assembly is supported on, and fixed with respect to, said mounting surface of said first lens.

9. The camera module of claim 8, wherein
said first end of said lens barrel includes a top surface defining an opening, and
at least a portion of said first lens extends through said opening such that the distance between said mounting surface of said first lens and said image sensor is greater than the distance between said top surface of said lens barrel and said image sensor.

10. The camera module of claim 8, further comprising adhesive disposed between said actuator assembly and said lens barrel.

11. The camera module of claim 8, further comprising a spacer interposed between, and in contact with, said mounting surface of said actuator assembly and said mounting surface of said first lens.

12. The camera module of claim 8, wherein said actuator assembly includes a microelectromechanical systems (MEMS) actuator.

13. The camera module of claim 8, further comprising a third lens, and wherein:
said third lens is fixably disposed in said lens barrel;
at least one of said first lens and said third lens includes a passive alignment feature facilitating the passive alignment of said third lens with respect to said first lens.

14. A method of manufacturing a camera module, said method comprising:
providing a lens barrel having a first end and a second end;
providing a first lens having an optical surface and a mounting surface;
fixing said first lens with respect to said lens barrel proximate said first end of said barrel;
providing an image sensor;
fixing said image sensor proximate said second end of said barrel;
providing an actuator assembly including a second lens and a mounting surface;
supporting said mounting surface of said actuator assembly on said mounting surface of said first lens; and
fixing said actuator assembly with respect to said mounting surface of said first lens.

15. The method of claim 14, wherein:
said first end of said lens barrel includes a top surface defining an opening; and
at least a portion of said first lens extends through said opening such that the distance between said mounting surface of said first lens and said image sensor is greater than the distance between said top surface of said lens barrel and said image sensor.

16. The method of claim 14, wherein said step of fixing said actuator assembly with respect to said mounting surface of said first lens includes depositing adhesive between said actuator assembly and said lens barrel.

17. The method of claim 14, further comprising:
providing a spacer; and wherein
said step of supporting said mounting surface of said actuator assembly on said mounting surface of said first lens includes positioning said spacer between said mounting surface of said actuator and said mounting surface of said first lens.

18. The method of claim 14, wherein said step of providing an actuator assembly includes providing a microelectromechanical systems (MEMS) actuator.

19. The method of claim 14, further comprising:
providing a third lens;
disposing said third lens in said lens barrel; and
passively aligning said third lens with respect to said first lens.

20. The method of claim 14, further comprising actively aligning said mounting surface of said actuator assembly with respect to said mounting surface of said first lens.

* * * * *